United States Patent [19]
Hall et al.

[11] Patent Number: 5,101,158
[45] Date of Patent: Mar. 31, 1992

[54] INVESTIGATING A SAMPLE USING NMR

[76] Inventors: Laurence D. Hall, 22 Long Road, Cambridge CB2 2QS; Timothy J. Norwood, 49 Jesus Lane, both of Cambridge, England

[21] Appl. No.: 598,721
[22] PCT Filed: Apr. 20, 1988
[86] PCT No.: PCT/GB88/00300
  § 371 Date: Dec. 3, 1990
  § 102(e) Date: Dec. 3, 1990
[87] PCT Pub. No.: WO89/10553
  PCT Pub. Date: Nov. 2, 1989
[51] Int. Cl.$^5$ .............................. G01R 33/20
[52] U.S. Cl. ..................... 324/309; 324/307
[58] Field of Search ............... 324/300, 307, 309, 310, 324/311, 312, 313, 314, 318, 322; 128/653 R, 653 A

[56] References Cited

U.S. PATENT DOCUMENTS

| | | |
|---|---|---|
| 4,134,058 | 1/1979 | Ernst . |
| 4,238,735 | 12/1980 | Muller .................. 324/314 |
| 4,626,783 | 12/1986 | Ohuchi .................. 324/307 |
| 4,680,546 | 7/1987 | Dumoulin ............... 324/307 |
| 4,703,270 | 10/1987 | Hall et al. ............. 324/309 |
| 4,714,882 | 12/1987 | Nagayama . |
| 4,972,147 | 11/1990 | Van Vaals ............. 324/307 |
| 5,045,790 | 9/1991 | Hall et al. ............. 324/307 |

FOREIGN PATENT DOCUMENTS 0234724 10/1987 European Pat. Off. .
2109116 5/1983 United Kingdom .

OTHER PUBLICATIONS

Journal of Magnetic Resonance, vol. 40, 1980 Academic Press, Inc. (N.Y., U.S.), "Experimental Techniques of Two-Dimensional Correlated Spectroscopy", pp. 321-334.

Primary Examiner—Michael J. Tokar
Attorney, Agent, or Firm—Brumbaugh, Graves, Donohue & Raymond

[57] ABSTRACT

A method of investigating a sample using nuclear magnetic resonance comprises: I) applying a magnetic field across the sample, II) applying an RF pulse to create single quantum coherences within the sample, III) applying a coherence transfer pulse after one of a first and second type of period, IV) sensing the free induction decay (FID) signa generated by the sample after the other of the first and second types of period and repeating steps II-IV with different durations ($D_1$) of the first type of period, the duration ($D_2$) of the second type of period being constant wherein during the first type of period nuclear spins of the single quantum coherence are allowed to evolve under the influence of the surrounding sample and magnetic field for the duration $D_2$ of the first period type, and wherein at the end of one portion of duration $D_{21}$ where $D_{21}=D_2-D_1$, of the second type of period nuclear spins of the single quantum coherences have evolved only under the influence of scaler coupling with other spins while for the remainder of the second type of period nuclear spins of the single quantum coherences are allowed to evolve under the influences of the surrounding sample and magnetic field.

9 Claims, 4 Drawing Sheets $\theta = x, y, -x, -y$ $\phi = x, -x, x, -x$

Acq = DATA ACQUISITION n = FACTOR WHICH MAY BE ADJUSTED TO ALTER THE RELATIVE SCALES OF CHEMICAL SHIFT AND SCALAR COUPLINGS IN THE SPECTRUM

INVESTIGATING A SAMPLE USING NMR

FIELD OF THE INVENTION

The invention relates to methods for investigating a sample using nuclear magnetic resonance (NMR).

DESCRIPTION OF THE PRIOR ART

It is well known that certain nuclei, for example the hydrogen nucleus, exhibit an intrinsic spin so that when the nucleus is exposed to a magnetic field it will precess around the magnetic field with a frequency $\omega$ known as the Larmor frequency with the spin preferentially aligned in the direction of the magnetic field.

In general, since the nucleus concerned will be surrounded by electrons associated with the chemical structure of the molecule containing the nucleus, the magnetic field experienced by the nucleus will be modified by the screening effect of those electrons. This will cause each chemically different set of nuclei to precess at a slightly different Larmor frequency. This phenomenon, known as chemical shift, reflects the chemical environment of a nucleus and enables the chemical structure of many molecules to be determined by observing the precession frequencies present within the sample.

The intrinsic spin of a spin-$\frac{1}{2}$ nucleus is quantised and can take up one of two states, either parallel or anti-parallel with the main magnetic field. In the presence of the main magnetic field only, the spins will preferentially take up the parallel state, to produce a net magnetisation vector in that direction. However, the injection of energy in the form of a radio frequency pulse will cause a proportion of the nuclei in the sample to change their spin state causing a rotation of the net magnetisation vector from alignment with the main field to a direction dependent on the duration of the pulse. The component of the vector which is perpendicular to the direction of the field can then be observed to precess about it due to chemical shift and scalar couplings.

It has been found that the spins of adjacent magnetic nuclei interact (scalar spin-spin coupling) via the electrons of the intervening bonds. In a simple case of two nuclei, the two spin system can exist in four different states depending on the relative orientations of the respective spins to each other and to the main field. In this instance the spin system will give rise to four single-quantum transitions; in the (conventional) single-quantum coherence spectrum the chemically shifted peak of each spin will be split into two lines, the splitting between which is known as the scalar coupling constant. In general, the number of component lines of a multiplet into which the resonance of a particular spin is split is dependent upon the number and type of adjacent spins.

The energy associated with a simple two spin system in which the spins are labelled A, X is given by the formula:

$$J_{ax}I_aI_x$$

where $J_{ax}$ is the scalar coupling constant and $I_a$, $I_x$ are the nuclear angular momentum vectors associated with each spin. It will be noted that this energy is independent of magnetic field strength.

Knowledge of the scalar coupling constant enables properties of the sample to be derived such as the angle between bonds of adjacent nuclei and the number of intervening bonds. The size of the scalar coupling constant can be obtained by determining the separation between the components of a multiplets within a chemical shift band.

In the past, in order to obtain this information, static magnetic fields of very high homogeneity have been required: to 1 part in $10^9$ to resolve scalar couplings, and to 1 part in $10^7$ to resolve chemical shifts. Recently, techniques have been developed to obtain the information with lower homogeneity fields and examples include the use of zero-quantum coherence or, alternatively, the N-type peaks produced by the SECSY experiment as described in J. Magn. Reson. 1980, 40, 321. However, neither technique produces the conventional single-quantum spectrum of a spin system.

SUMMARY OF THE INVENTION

In accordance with the present invention, we provide a method of investigating a sample using nuclear magnetic resonance, the method comprising:

I. Applying a magnetic field across the sample;
II. Applying a rf pulse to create single quantum coherences within the sample;
III. Applying a coherence transfer pulse after one of a first and second type of period;
IV. Sensing the free induction decay (FID) signal generated by the sample after the other of the first and second types of period;

and repeating steps II–IV with different durations ($D_1$) of the first type of period, the duration ($D_2$) of the second type of period being constant wherein during the first type of period nuclear spins of the single quantum coherences are allowed to evolve under the influence of the surrounding sample and magnetic field for the duration $D_1$ of the first period type, and wherein at the end of one portion of duration $D_{21}$, where $D_{21} = D_2 - D_1$, of the second type of period nuclear spins of the single quantum coherences have evolved only under the influence of scalar coupling with other spins while for the remainder of the second type of period nuclear spins of the single quantum coherences are allowed to evolve under the influences of the surrounding sample and magnetic field.

We have recognised that one of the main problems with the known SECSY experiment is that the coherence transfer from the first spin to the second spin (step III) results in a mixing of the intrinsic parameters (chemical shift and scalar couplings) of each spin, so that chemical shifts, scalar couplings and multiplet structure cannot be extracted from the resulting spectrum. Thus, although this previous experiment cancelled out the effects of inhomogeneities in the magnetic field, there is still a problem in analysing the resultant signal.

To deal with this, we have specified the use of a second type of period which has a constant duration and at the end of a portion of which only the effects of scalar coupling have evolved while during the remainder of the second period the spins evolve in response not only to scalar coupling but also chemical shift, magnetic field inhomogeneties and the like in exactly the same way as in the first type of period. Since the duration of the second type of period is a constant, each time the experiment is repeated with a different value of $D_1$, the extent of scalar coupling evolution during the second type of period will be the same and it will therefore not be encoded with respect to $D_2$. In contrast, since the total duration $D_1$ of the first type of period is allowed to vary, scalar coupling during that period, which relates only to one type of spin involved in each coherence transfer, will be encoded with respect to $D_1$ and can therefore be monitored.

Preferably, the method comprises in step IV sensing the initial amplitude and phase of the FID signal and, after repeating steps II-IV a number of times, transforming the resultant set of amplitudes and phases expressed as a function of the first period type duration into the frequency domain. For example, this transformation could comprise a Fourier transformation. The transformation with respect to the duration of the first period type will automatically cancel the effect of scalar coupling during the second type of period which, as mentioned above, occurs over a fixed time period independent of the duration of the first type of period.

The order of the first and second types of period is not important and the portion of the second type of period at the end of which the spins have evolved only under the influence of scalar coupling can occur at any time during the second type of period.

Typically, a 180° rf pulse is injected into the sample orthogonal to the magnetic field at the mid point of the one portion, $D_{21}$, of the second type of period. This 180° pulse causes the cancellation of the evolution of chemical shift and magnetic inhomogeneity occurring during that one portion.

Typically in an inhomogeneous magnetic field, steps II-IV only need to be carried out once for each duration of the first type of period. In a homogeneous field, however, it is usually necessary to repeat steps II-IV cycling the phases of the r.f. pulses through each of the four mutually orthogonal directions which are also orthogonal to the main magnetic field. In this context by inhomogeneous we mean a homogeneity of less than 1 part to $10^6$.

In some cases, analysis of the resultant spectrum is difficult due to the close spacing of the peaks which comprise a multiplet. In order to increase the spacing, the method may further comprise inserting within the first type of period a scaling pulse sequence comprising a 180° rf pulse preceeded and followed by equal time intervals. It should be understood that the extent of evolution due to chemical shift and magnetic field inhomogeneity is effectively unaffected by the insertion of this additional pulse sequence. Typically, the time intervals before and after the 180° scaling pulse comprise multiples of the duration of the first type of period.

DESCRIPTION OF THE DRAWINGS

Some examples of methods according to the invention will now be described with reference to the accompanying drawings, in which.

DETAILED DESCRIPTION OF THE EMBODIMENTS

The methods to be described can be performed on conventional NMR spectrometers.

Figure 1:
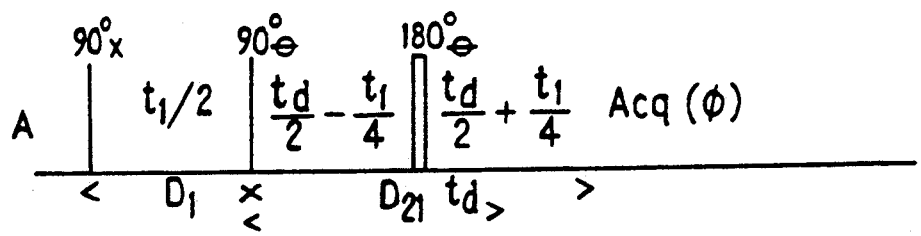
FIGS. 1A, 1B, 1C, 1D, 1E, 1F, 1G, 1H, 1I, 1J, 1K, and 1L illustrate a series of pulse sequences.
Figure 1:
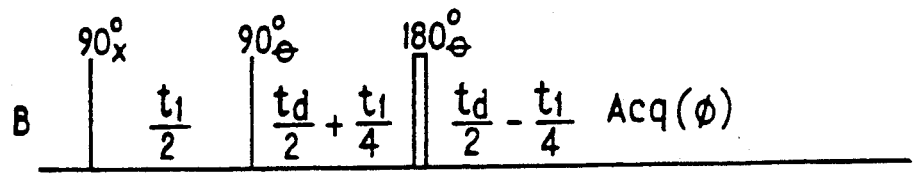
Figure 1:
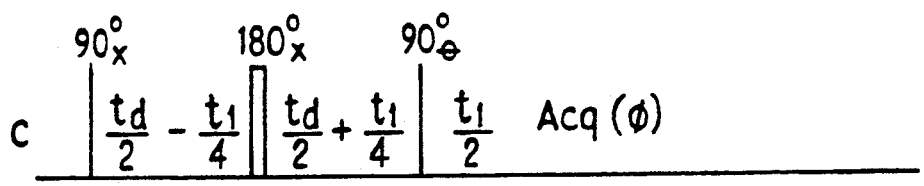
Figure 1:
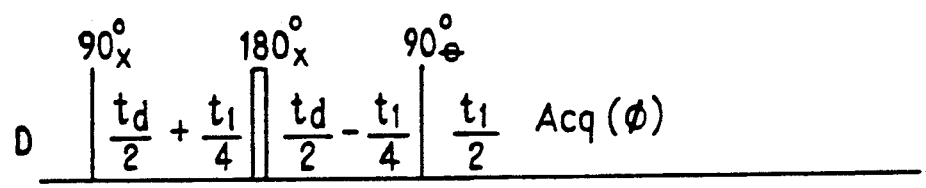
Figure 1:
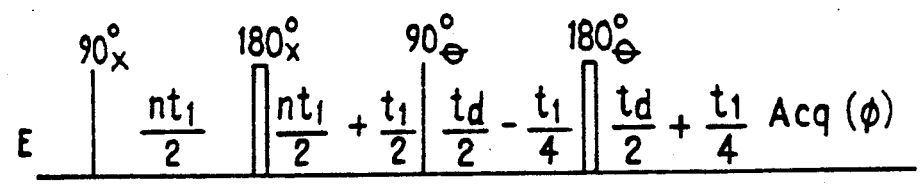
Figure 1:
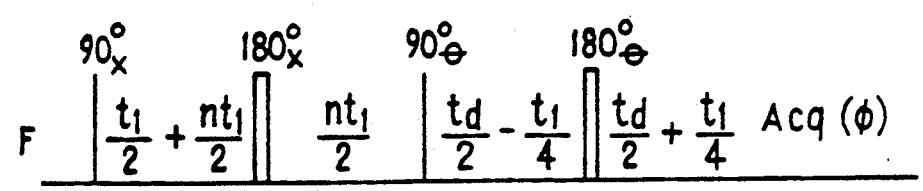
Figure 1:
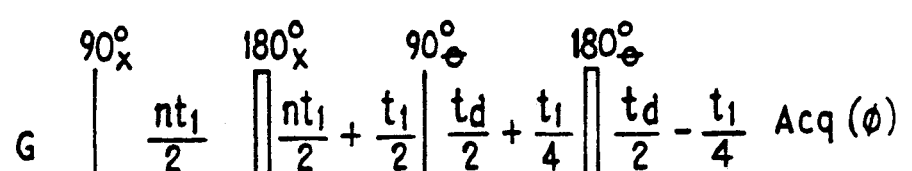
Figure 1:
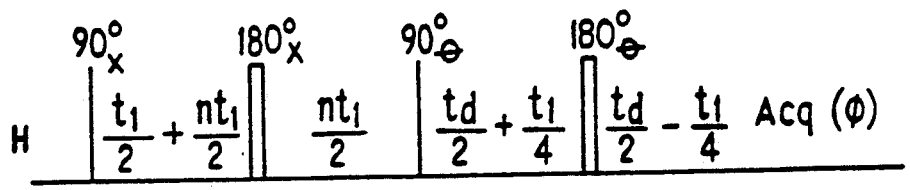
Figure 1:
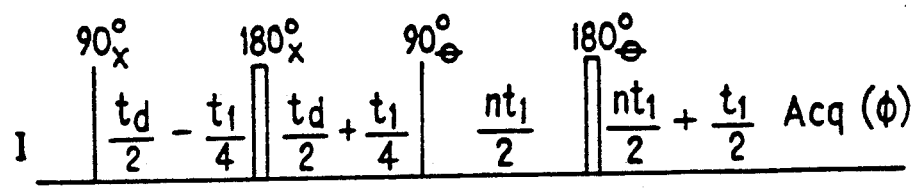
Figure 1:
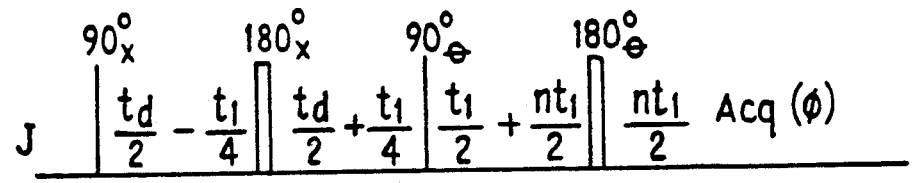
Figure 1:
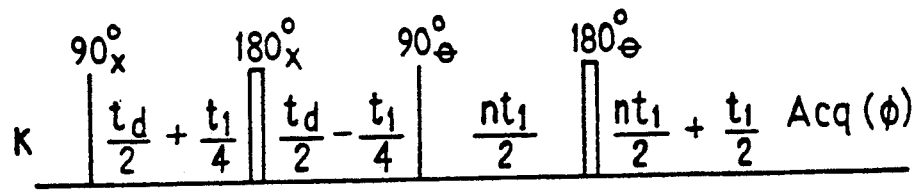
Figure 1:
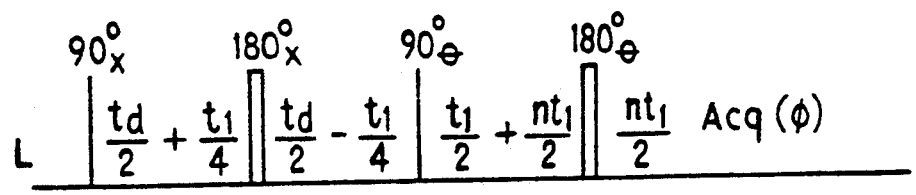

A simple pulse sequence is shown in FIG. 1A. It is assumed that the main magnetic field is applied along the Z axis which is orthogonal to the X and Y axes which are themselves mutually orthogonal. Initially, a 90° rf pulse is applied along the X direction to create single quantum coherences (SQC). In this example, this pulse is followed by the first type of period for a duration $D_1$ expressed in conventional nomenclature as $t_1/2$. At the end of this period, a further 90° pulse is injected into the sample as a coherence transfer pulse. This defines the commencement of the second type of period which extends for a duration $t_d$ (corresponding to $D_2$). It is necessary during this second period for there to be a total time $t_1/2$ during which spins can evolve under the influence of their surroundings due to effects such as chemical shift, scalar coupling, and magnetic inhomogeneities. This leaves a period $t_d - t_1/2$ (corresponding to period $D_{21}$) at the end of which it is intended that spins should have evolved only under the influence of scalar coupling. To achieve this, a 180° pulse is injected into the sample mid-way through this special portion of the second period, the time of the pulse occurring at a time $t_d/2 - t_1/4$ after the commencement of the special portion. In the example of FIG. 1A the special portion commences after the second 90° pulse and terminates at a time $t_d/2 - t_1/4$ after the 180° pulse. This leaves a period $t_1/2$ after that, as required. Finally, the FID is monitored and in particular the initial amplitude of the FID is recorded.

If the method is being performed in a substantially inhomogeneous field, the pulse sequence in FIG. 1A is then repeated for different values of $t_1$ in order to build up a new function relating the initial FID amplitudes with $t_1$. Finally, this function is transformed into the frequency domain.

If the pulse sequence is being formed in a substantially homogeneous field then for each value of $t_1$, the pulse sequence will be repeated with $\theta$ equal to x, y, $-x$, $-y$ respectively with the FID being monitored in the direction x, $-x$, x, $-x$ respectively.

Figure 2A:
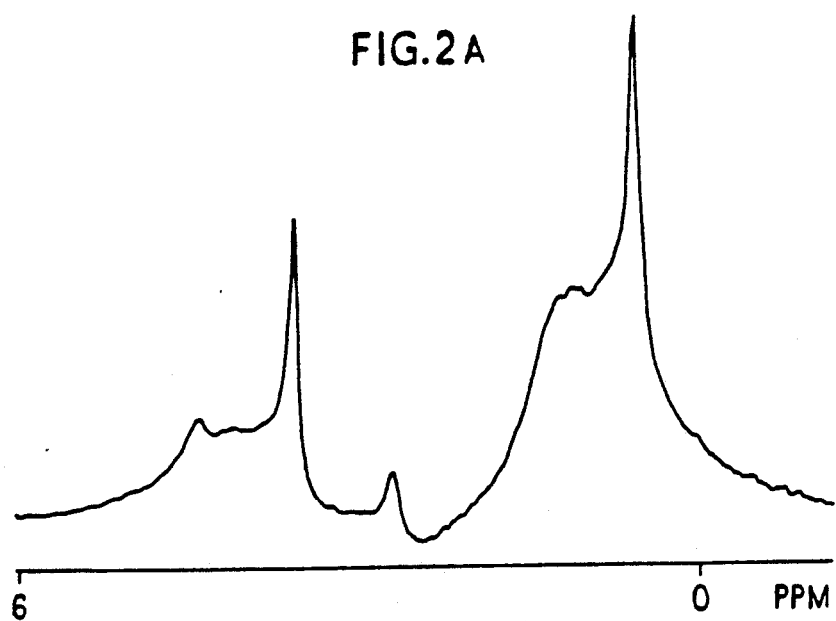
FIGS. 2A, 2B, and 2C illustrate $^1$H NMR (300-MHz) spectra of a 0.1M solution of the $AX_3$ spin system L-alanine in $D_2O$ acquired in an inhomogeneous magnetic field. (A) Conventional SQC spectrum; (B) SECSY spectrum (512 $t_1$ values, 1 scan each, F1 projection taken); (C) spectrum obtained with pulse sequence in FIG. 1 I ($t_d$=300ms, n=0.5, 512 $t_1$ values, 8 scans each, F1 projection taken)
Figure 2B:
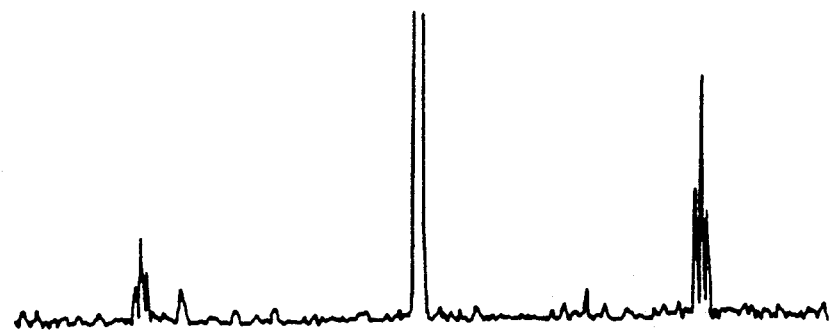
Figure 2C:
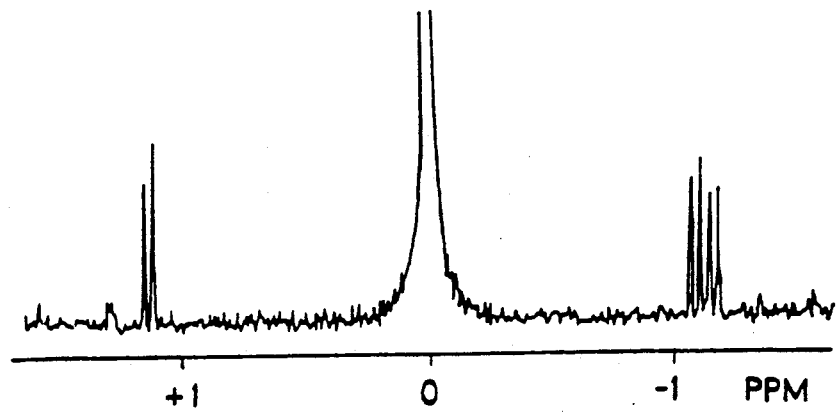
Figure 3A:
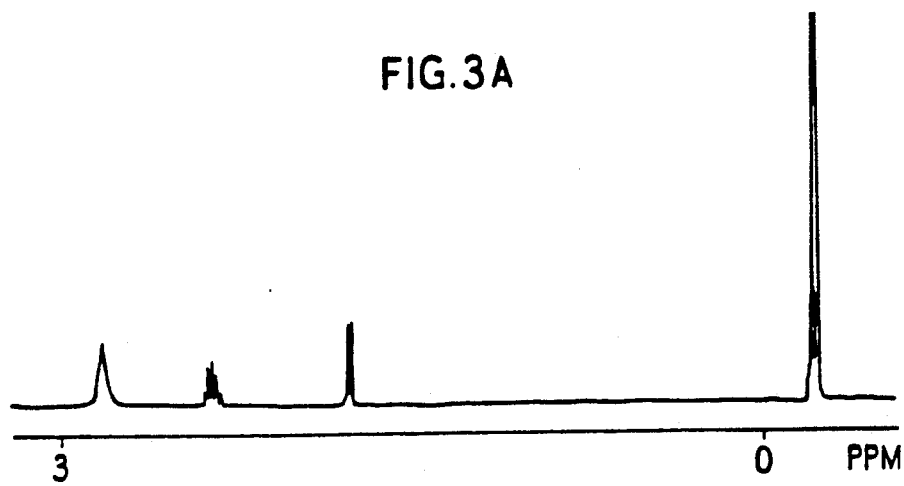
FIGS. 3A, 3B, 3C, and 3D illustrate $^1$H NMR (300-MHz) spectra of a 0.5M solution of the $AMX_3$ spin system L-threonine in $D_2O$. (A) Conventional high-resolution SQC spectrum. In an inhomogeneous magnetic field; (B) conventional SQC spectrum; (C) spectrum obtained with pulse sequence I with identical multiplets indicated ($t_d$=340 ms, n=704 $t_1$ values, 8 scans each, F1 projection taken); (D) SQC spectrum reassembled from (C). The base line is artificial.
Figure 3B:
Figure 3C:
Figure 3D:
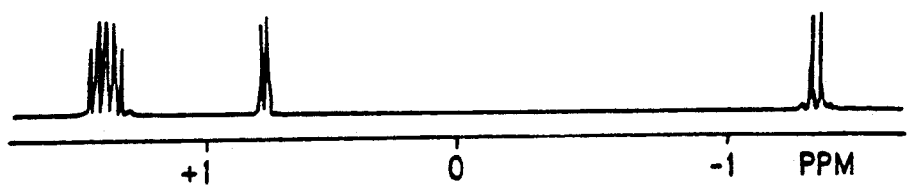

FIG. 2 shows the spectrum of the $AX_3$ spin system L-alanine in an inhomogeneous magnetic field produced by this pulse sequence, along with the corresponding conventional and SECSY spectra for comparison. Unlike the conventional spectrum (A), the spectrum (C) produced by the pulse sequence of FIG. 1A is still at high resolution, and unlike the SECSY spectrum (B), it exhibits only conventional multiplets and coupling constants. However, as with SECSY, peaks only occur at plus and minus half the difference in the chemical shifts of the pairs of coupled spins. With the SECSY experiment, each pair of N-type peaks is the result of the chemical shift and scalar coupling evolution of a pair of spins, whereas a peak produced by the FIG. 1A pulse sequence, although the result of the chemical shift evolution of the two spins, involves the scalar coupling evolution of only one of the spins. The result of this is that of each pair of N-type peaks one peak will exhibit the normal multiplet of the one of the spins giving rise to it, and the other will only exhibit the multiplet of the other.

FIG. 1B illustrates a variation of the FIG. 1A pulse sequence in which the special portion occurs at the end of the second period while FIGS. 1C and 1D correspond to the pulse sequences of FIGS. 1A and 1B but with the order of the first and second periods reversed.

To facilitate easy analysis of the spectrum, the pulse sequence has been designed in such a way that the relative scales of the chemical shift and scalar couplings can be altered. Although it is actually the chemical shift which is being scaled down, the pulse sequence is constructed such that it appears that it is the scalar couplings which are being scaled up. This has the advantage that the $t_1$ increment does not have to be altered each time the relative scales of chemical shift and scalar couplings are altered.

An example of how the pulse sequence in FIG. 1A is modified to scale the resultant spectrum is illustrated in FIG. 1E. It will be seen in FIG. 1E that the first period which in this case commences after the initial 90° pulse includes an additional 180° pulse along the x axis at the centre of a pair of evolution periods having durations $nt_1/2$. This scaling period is then followed by the usual $t_1/2$ duration of the first period.

The scaling is determined by the factor n and results in an apparent J scale of $(n+\frac{1}{2})$; it is accomplished by the three intervals immediately after the second 90° pulse $((nt_1/2)-180° (\theta)-(nt_1/2))$. If these intervals are omitted from the pulse sequence, the J scale will be $(\frac{1}{2})$. Scaling can either be used to improve the digitization of the multiplets or to decrease the number of increments, and hence time, required to obtain the same digitization of the multiplets.

FIG. 1F illustrates an alternative form of the pulse sequence of FIG. 1E in which the scaling sequence occurs after the duration $t_1/2$ of the first period but before the second 90° pulse. FIGS. 1G-1L illustrate the two scaling sequences in association with each of the other pulse sequences shown in FIGS. 1B-1D.

If a spin is associated with several different N-type peak pairs, in each case one peak of each pair will exhibit the multiplet of that spin. This facilitates the elucidation of scalar coupling networks. In addition, in this particular pulse sequence (I), the splittings in the negative-frequency peak will always correspond to those of the spin which has the lower field chemical shift. As a consequence of this, the relative chemical shifts of whole spin systems, rather than just pairs of spins, can be determined. Visually the conventional (single quantum coherence) spectrum of a spin system may be reassembled in three steps: first, the peak at 0.0 Hz is removed; second, peak pairs are moved horizontally, keeping the frequency difference between each pair of peaks constant, until all identical multiplets overlap; finally, the spectrum must be reversed (reflected about 0.0 Hz). This is demonstrated for the $AMX_3$ spin system L-threonine in FIG. 3.

The value of $t_d$ is fixed for a given experiment. It may have any value above a minimum determined by N (the number) and $\Delta t_1$ (the size) of $t_1$ increments, according to the expression $t_d \geq N\Delta t_1/2$. Peak intensities are dependent upon $t_d$ and the scalar couplings of a spin system. Consequently, spectra obtained with several values of $t_d$ may have to be coadded to obtain the complete spectrum. Conversely, if several peaks do overlap, this dependency may be used to resolve them.

We claim:

1. A method of investigating a sample using nuclear magnetic resonance the method comprising
   I. applying a magnetic field across the sample;
   II. applying a rf pulse to create single quantum coherences within the sample;
   III. applying a coherence transfer pulse after one of a first and second type of period;
   IV. sensing the free induction decay (FID) signal generated by the sample after the other of the first and second types of period;
   and repeating steps II-IV with different durations ($D_1$) of the first type of period, the duration ($D_2$) of the second type of period being constant wherein during the first type of period nuclear spins of the single quantum coherences are allowed to evolve under the influence of the surrounding sample and magnetic field for the duration $D_1$ of the first period type, and wherein at the end of one portion of duration $D_{21}$, where $D_{21}=D_2-D_1$, of the second type of period nuclear spins of the single quantum coherences have evolved only under the influence of scalar coupling with other spins while for the remainder of the second type of period nuclear spins of the single quantum coherences are allowed to evolve under the influences of the surrounding sample and magnetic field.

2. A method according to claim 1, wherein the initial amplitude and phase of the FID signal is sensed in step IV and, after repeating steps II-IV a number of times, transforming the resultant set of amplitudes and phases expressed as a function of the first period type duration into the frequency domain.

3. A method according to claim 2, wherein the transformation comprises a Fourier transformation.

4. A method according to claim 1, wherein a 180° rf pulse is injected into the sample orthogonal to the magnetic field at the mid point of the one portion, $D_{21}$, of the second type of period.

5. A method according to claim 1, wherein the magnetic field applied across the sample is inhomogeneous.

6. A method according to claim 1, further comprising providing before the beginning or after the end of the first type of period a scaling pulse sequence comprising a 180° rf pulse preceeded and followed by equal time intervals.

7. A method according to claim 6, wherein the time intervals before and after the 180° scaling pulse comprise multiples of the duration of the first type of period.

8. A method according to claim 1, wherein the first type of period is split into temporally separate portions by a scaling pulse sequence comprising a 180° rf pulse preceeded and followed by equal time intervals.

9. A method according to claim 8, wherein the time intervals before and after the 180° scaling pulse comprise multiples of the duration of the first type of period.

* * * * *